United States Patent
Liu et al.

(10) Patent No.: US 11,778,910 B2
(45) Date of Patent: Oct. 3, 2023

(54) ELECTRONIC DEVICE

(71) Applicant: Lenovo (Beijing) Co., Ltd., Beijing (CN)

(72) Inventors: Shuo Liu, Beijing (CN); Xiaodong Liu, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 532 days.

(21) Appl. No.: 16/728,826

(22) Filed: Dec. 27, 2019

(65) Prior Publication Data

US 2020/0212283 A1 Jul. 2, 2020

(30) Foreign Application Priority Data

Dec. 29, 2018 (CN) .......................... 201811640176.8

(51) Int. Cl.

| | |
|---|---|
| *F25B 21/00* | (2006.01) |
| *H10N 10/17* | (2023.01) |
| *E05B 47/00* | (2006.01) |
| *G06F 1/18* | (2006.01) |
| *G06F 1/26* | (2006.01) |
| *H01L 23/34* | (2006.01) |
| *G06F 1/20* | (2006.01) |

(Continued)

(52) U.S. Cl.
CPC ......... *H10N 10/17* (2023.02); *E05B 47/0001* (2013.01); *G06F 1/182* (2013.01); *G06F 1/206* (2013.01); *G06F 1/26* (2013.01); *G06F 11/3058* (2013.01); *H01L 23/34* (2013.01); *H10N 10/817* (2023.02)

(58) Field of Classification Search
None
See application file for complete search history.

(56) References Cited

U.S. PATENT DOCUMENTS

| | | | |
|---|---|---|---|
| 6,226,994 B1 * | 5/2001 | Yamada | H01L 35/32 136/203 |
| 7,795,711 B2 * | 9/2010 | Sauciuc | H01L 35/16 136/203 |

(Continued)

FOREIGN PATENT DOCUMENTS

| | | |
|---|---|---|
| CN | 102291057 A | 12/2011 |
| CN | 203934244 U | 11/2014 |

(Continued)

*Primary Examiner* — Courtney L Smith
(74) *Attorney, Agent, or Firm* — ANOVA LAW GROUP, PLLC (57) ABSTRACT

An electronic device includes a first portion and a second portion, an electric power generating device and a load device. The electronic device is disposed in an opening of a connected space, and the electronic device and a wall have the opening divide the connected space into the first space and the second space. The first portion is located in a first space having a first ambient temperature, and the second portion is located in a second space having a second ambient temperature. The electric power generating device is configured to generate a thermo-electromotive force based on a temperature difference between the first ambient temperature and the second ambient temperature to generate electrical energy. The load device is configured to obtain the electrical energy and operate on the electrical energy.

8 Claims, 4 Drawing Sheets

(51) Int. Cl.
*G06F 11/30* (2006.01)
*H10N 10/817* (2023.01)

(56) References Cited

U.S. PATENT DOCUMENTS

| | | | | |
|---|---|---|---|---|
| 9,182,294 B2* | 11/2015 | Savelli | .................... | H01L 35/34 |
| 9,209,106 B2* | 12/2015 | Shi | .................... | H01L 23/49833 |
| 9,322,580 B2* | 4/2016 | Hershberger | ........... | H01L 35/30 |
| 9,781,821 B2* | 10/2017 | Chen | ....................... | H05K 1/115 |
| 9,857,107 B2* | 1/2018 | Inaba | ....................... | F25B 21/02 |
| 2003/0183269 A1* | 10/2003 | Maeda | .................... | H01L 35/30 |
| | | | | 136/211 |
| 2005/0126184 A1* | 6/2005 | Cauchy | .................... | H01L 35/30 |
| | | | | 62/3.3 |
| 2016/0020375 A1* | 1/2016 | Kuroki | .................... | H01L 35/30 |
| | | | | 136/201 |

FOREIGN PATENT DOCUMENTS

| | | |
|---|---|---|
| CN | 103853214 B | 4/2016 |
| CN | 108286853 A | 7/2018 |

* cited by examiner

ELECTRONIC DEVICE

CROSS-REFERENCE TO RELATED APPLICATION

This application claims the priority to Chinese Patent Application No. 201811640176.8, entitled "An Electronic Device", filed on Dec. 29, 2018, the entire content of which is incorporated herein by reference.

TECHNICAL FIELD

The present disclosure relates to the field of electronic technology, and more specifically, to designing an electronic device.

BACKGROUND

With the continued development of science and technology, more and more electronic devices are widely used in people's daily life, which has brought great convenience to people's daily life and has become indispensable.

Electric energy is a prerequisite for realizing various functions of electronic devices. Therefore, electric energy is the cornerstone of the current electronic information society. Most existing electronic devices directly or indirectly depend on the electric grid and consume a lot of energy from the electric grid.

SUMMARY

According to one aspect of the present disclosure, an electronic device is provided. The electronic device includes a first portion and a second portion, an electric power generating device and a load device. The electronic device is disposed in an opening of a connected space, and the electronic device and a wall have the opening divide the connected space into the first space and the second space. The first portion is located in a first space having a first ambient temperature, and the second portion is located in a second space having a second ambient temperature. The electric power generating device is configured to generate a thermo-electromotive force based on a temperature difference between the first ambient temperature and the second ambient temperature to generate electrical energy. The load device is configured to obtain the electrical energy and operate on the electrical energy.

According to another aspect of the present disclosure, an electrical appliance is provided. The electrical appliance includes an electric power generating device, a load, an indoor temperature sensor and an outdoor temperature sensor. The electric power generating device is configured to generate a thermo-electromotive force based on a temperature difference between opposite surfaces of a wall located on a central axis of a housing having the electric power generating device to generate electrical energy. The wall divides a space surrounding the electric power generating device into an indoor space and an outdoor space. The load operates on the electrical energy generated by the electric power generating device. The indoor temperature sensor is configured to detect an indoor temperature and the outdoor temperature sensor is configured to detect an outdoor temperature.

According to further aspect of the present disclosure, a computer chassis is provided. The computer chassis includes an electric power generating device, an electronic component, a first temperature sensor and a second temperature sensor. The electric power generating device is configured to generate a thermo-electromotive force based on a temperature difference between a first surface and a second surface of the computer chassis to generate electricity. The electronic component is disposed inside the chassis and generating heat during operating. The first temperature sensor is configured to detect a first temperature on the first surface and the second temperature sensor configured to detect a second temperature on the second surface.

BRIEF DESCRIPTION OF THE DRAWINGS

In order to explain the technical solutions in the embodiments of the present disclosure or the existing technology more clearly, the drawings used in the description of the embodiments or the existing technology are briefly introduced below. Apparently, the drawings in the description merely refer to the embodiments of the present disclosure. For those of ordinary skill in the art, other drawings may be obtained based on the provided drawings without creative efforts.

DETAILED DESCRIPTION OF THE EMBODIMENTS

The technical solutions in the embodiments of the present disclosure will be clearly and completely described below with reference to the drawings in the embodiments of the present disclosure. Obviously, the described embodiments are only a part but not all of the embodiments of the present disclosure. Based on the embodiments in the present disclosure, all other embodiments obtained by a person of ordinary skill in the art without creative efforts shall fall within the protected scope of the present disclosure.

In order to make the foregoing objectives, features, and advantages of the present disclosure more comprehensible, the present disclosure is further described in detail below with reference to the accompanying drawings and specific embodiments.

Figure 1:
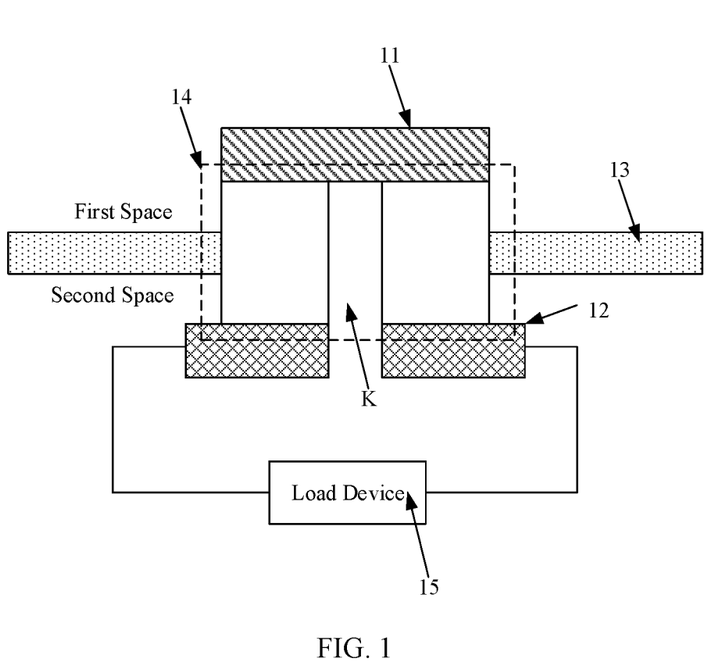
FIG. 1 is a schematic structural diagram of a first electronic device according to some embodiment of the present disclosure.

Referring to FIG. 1, FIG. 1 is a schematic structural diagram of an electronic device according to some embodiment of the present disclosure. As shown in FIG. 1, the electronic device includes a first portion 11 and a second portion 12. When the electronic device is disposed in an opening K for connecting spaces, the electronic device and the wall 13 having the opening K are configured to divide a space into a first space and a second space. The first portion 11 is located at the first space having a first ambient temperature, and the second portion 12 is located at the second space having a second ambient temperature.

The electronic device further includes an electric power generating device 14. The electric power generating device 14 is configured to generate a thermo-electromotive force based on a temperature difference between a first ambient temperature where the first portion 11 is located and a second ambient temperature where the second portion 12 is located, to generate electrical energy. A load device 15 is configured to obtain the electrical energy and operate on the electrical energy. For example, the load device 15 may be an electrical energy consumption device configured to consume electrical energy to perform a set function, or an electrical energy storage device (e.g., a battery) configured to store electrical energy, or an electrical energy transmission device (e.g., a switch mode power supply) configured to supply electrical energy to other electronic devices.

Accordingly, the electronic device according to the embodiment of the present disclosure is configured to be disposed in the opening K that connects spaces, and is configured to divide a space into a first space and a second space together with the wall 13 having the opening K. The first portion 11 of the electronic device is configured to be located in the first space having the first ambient temperature and the second portion 12 is configured to be located in the second space having the second ambient temperature. The electric power generating device 14 may generate a thermo-electromotive force based on the temperature difference between the first ambient temperature and the second ambient temperature, to generate electrical energy. The load device 15 obtains the electrical energy and operates on the electrical energy. Accordingly, the electronic device automatically generates electrical energy based on the temperature difference in two spaces to supply to the load device 15 for operation, so that the electrical energy consumption of the electric grid can be reduced.

The first ambient temperature and the second ambient temperature are different. The electric power generating device 14 may generate a thermo-electromotive force based on the temperature difference between the first ambient temperature and the second ambient temperature to generate electrical energy.

If the first ambient temperature is higher than the second ambient temperature, the electric power generating device 14 generates a first thermo-electromotive force; and if the first ambient temperature is lower than the second ambient temperature, the electric power generating device 14 generates a second thermo-electromotive force. An electrode property corresponding to the first thermo-electromotive force is opposite to an electrode property corresponding to the second thermo-electromotive force.

Figure 2:
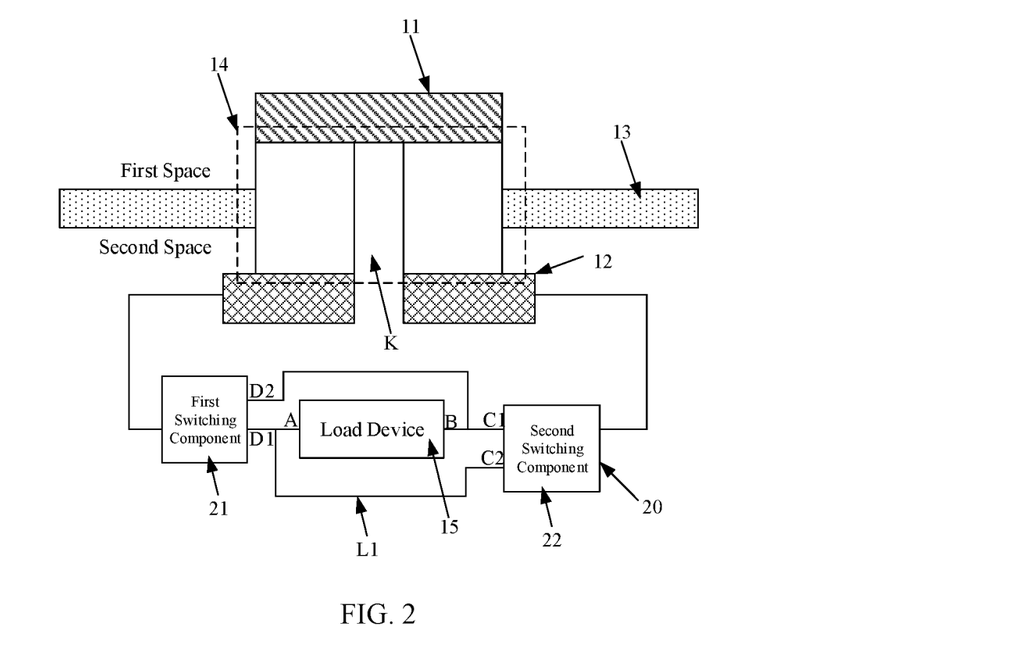
FIG. 2 is a schematic structural diagram of a second electronic device according to some embodiment of the present disclosure.

Referring to FIG. 2, FIG. 2 is a schematic structural diagram of an electronic device according to some embodiment of the present disclosure. The electronic device shown in FIG. 2 further includes a switching component 20 based on the electronic device shown in FIG. 1. The switching component 20 is configured to match a connection between an output port of the electric power generating device 14 and an input port of the load device 15 based on the electrode property that corresponds to the thermo-electromotive force, and to supply the electrical energy matching the electrode property to the load device 15. The load device 15 has two input ports, including an input port A of a first electrode input port A and an input port B of a second electrode.

As shown in FIG. 2, the switching component 20 includes a first switching component 21 and a second switching component 22. The first switching component 21 has a first output port D1 and a second output port D2, and the second switching component 22 has a first output port C1 and a second output port C2. The electric power generating device 14 has two output ports configured to output the thermo-electromotive force. Both switching components have input ports. One output port of the electric power generating device 14 is connected to an input port of the first switching component 21, and the other output port of the electric power generating device 14 is connected to the input port of the second switching component 22.

When there exists the first thermo-electromotive force, the first output port D1 of the first switching component 21 is turned on and is connected to the input port A of the first electrode, the second output port D2 of the first switching component 21 is turned off, the first output port C1 of the second switching component 22 is turned on and is connected to the input port B of the second electrode, and the second output port C2 of the second switching component is turned off. When there exists the second thermo-electromotive force, the first output port D1 of the first switching component 21 is turned off and the second output port D2 of the first switching component is turned on which is connected to the input port B of the second electrode, the first output port C1 of the second switching component 22 is turned off, and the second output port C2 of the second switching component 22 is turned on and is connected to the input port A of the first electrode. The electrode property corresponding to the first thermo-electromotive force is opposite to the electrode property corresponding to the second thermo-electromotive force, so that by disposing the switching component 20, when the electric power generating device 14 generates the first thermo-electromotive force or the second thermo-electromotive force, either can supply electrical energy matching a corresponding electrode property to the load device 15.

Figure 3:
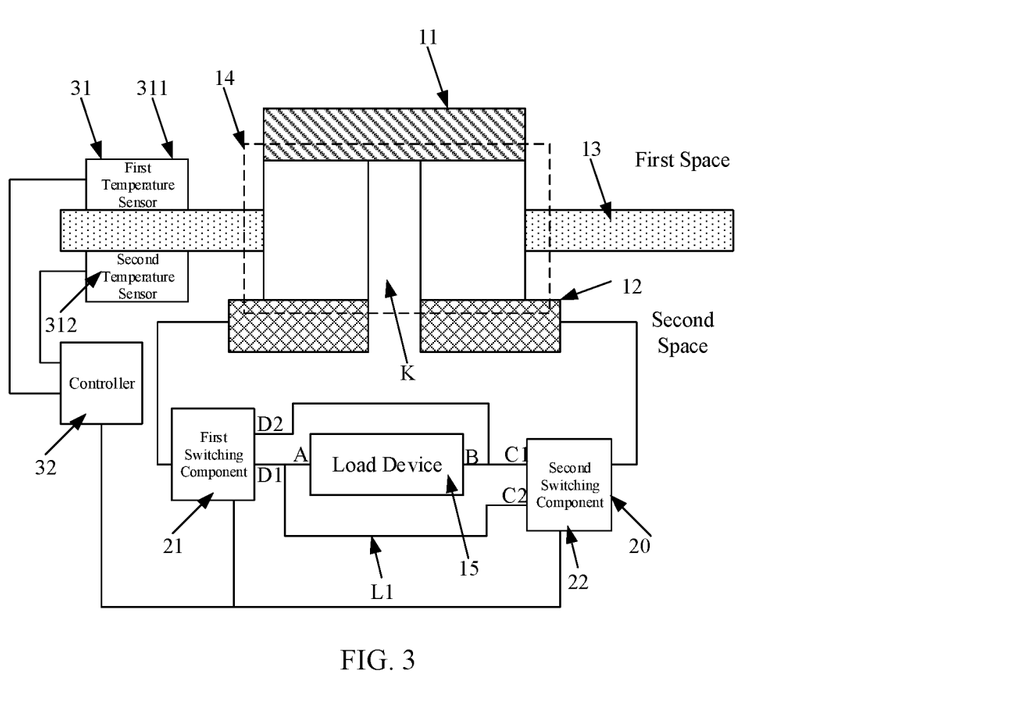
FIG. 3 is a schematic structural diagram of a third electronic device according to some embodiment of the present disclosure.

Referring to FIG. 3, FIG. 3 is a schematic structural diagram of an electronic device according to some embodiment of the present disclosure. The implementation manner is different from the manner shown in FIG. 1 in that the electronic device further includes a temperature sensor 31 configured to detect the first ambient temperature and the second ambient temperature and a controller 32 configured to match a connection between the output port of the electric power generating device 14 and the input port of the load device 15 based on the first ambient temperature and the second ambient temperature, so that the load device 15 obtain the electrical energy that matches the corresponding electrode property.

In the implementation manner shown in FIG. 3, the load device 15 may obtain the electrical energy that matches the corresponding electrode property by the switching component 20 that matches the connection between the output port of the electric power generating device 14 and the input port of the load device 15. Both the first switching component 21 and the second switching component 22 are electronic switches.

The temperature sensor 31 includes a first temperature sensor 311 disposed in the first space to detect the first ambient temperature, and a second temperature sensor 312 disposed in the second space to detect the second ambient temperature. The first temperature sensor 311 and the second temperature sensor 312 are both connected to the controller 32. The controller 32 generates a switch driven signal based on the first ambient temperature and the second ambient temperature to control an on/ff status of the first switching component 21 and the second switching component 22. If the first ambient temperature is higher than the second ambient temperature, a first switch control instruction is generated. The first switch control instruction causes the first output port D1 of the first switching component 21 to be turned on and the second output port D2 of the first switching component 21 to be turned off, so that the first output port C1 of the second switching component 22 can be turned on and the second output port C2 of the second switching component 22 can be turned off. If the first ambient temperature is lower than the second ambient temperature, a second switch control instruction is generated, and the second switch control instruction causes the second output port D2 of the first switching component 21 to be turned on and the first output port D1 of the first switching component 21 to be turned off, so that the second output port C2 of the second switching component 22 can be turned on and the first output port C1 of the second switching component 22 can be turned off.

Figure 4:
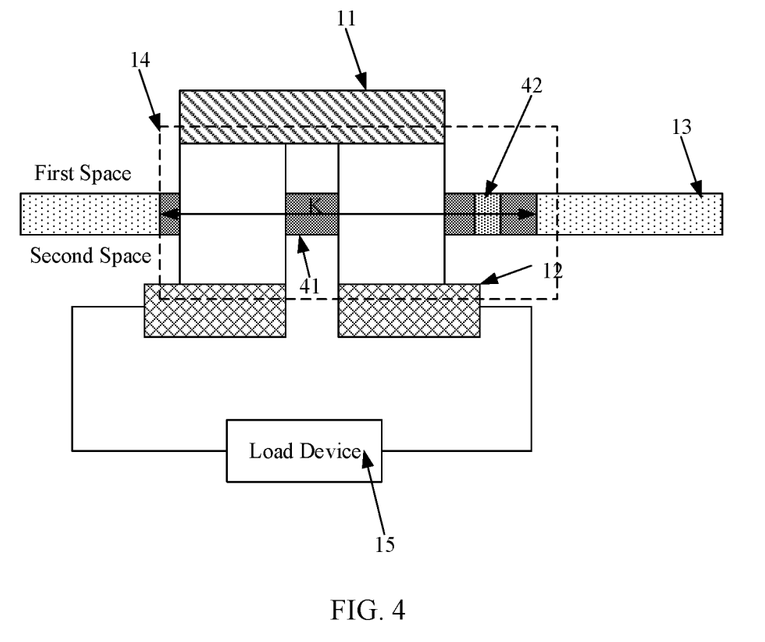
FIG. 4 is a schematic structural diagram of a fourth electronic device according to some embodiment of the present disclosure.

Referring to FIG. 4, FIG. 4 is a schematic structural diagram of an electronic device according to some embodiment of the present disclosure. The electronic device may, based on the foregoing embodiments, further include a movable body 41 connected to the wall 13 having the opening K. If the body 41 and the opening K meet a full coverage condition, the first space is separated from the second space. If the body 41 and the opening K do not meet the full coverage condition, the first space is connected to the second space. The full coverage condition is satisfied when the body 41 completely covers the opening K without a gap, or approximately covers the opening K with a gap between the two. The body 41 can switch between a state of the full coverage condition being satisfied and a state of the full coverage condition not being satisfied by rotating, or switch between the state of the full coverage condition being satisfied and the state of the full coverage condition not being satisfied by translation.

Optionally, as shown in FIG. 4, a collecting device 42 is disposed on the body 41, and the collecting device 42 can be configured to perceive a situation of the second space in the first space. For example, the collecting device 42 may include an outputting device to display information it perceives. The collecting device 42 may also be connected to other devices by a communication device, so as to send the collected information to other devices. The collecting device 42 includes an image collecting device and/or a sound collecting device.

Optionally, the electronic device is configured to control a movement scope of the body 41, or to detect whether the body 41 is moving, or to detect whether the body and the opening satisfy a full coverage condition. At this time, the load device of the electronic device may be a door magnetic switch or configured to supply power to a door magnetic switch. The electronic device is installed on a body such as a window or a door, may be configured to detect whether the body is moving or to detect whether the body and the opening meet the full coverage conditions, and may transmit an alarm signal based on a detected result.

In some embodiments of the present disclosure, the first portion 11 and the second portion 12 are respectively fixed on two opposite surfaces of the body 41. The electric power generating device 14 is located between the first portion 11 and the second portion 21. When the above full coverage condition is satisfied, the opposite two surfaces face the first space and the second space, respectively. The first portion 11 and the second portion 12 may be respectively contacted with and fixed to corresponding surfaces of the body 41, and the electric power generating device 14 may be inserted into the body 41. Two housings may be respectively disposed on the two opposite surfaces, and the first portion and the second portion may be respectively fixed on the two housings.

In the foregoing embodiments, the electronic device may be applied in a smart home device. For example, the electronic device may be a smart lock for a smart anti-theft door, and the wall having an opening may be a doorway for installing the anti-theft door. It can also be applied to an anti-theft window, and the wall having an opening may be a window for installing the anti-theft window.

When the electronic device is applied in a smart home device, one of the first space and the second space is an indoor space, and the other is an outdoor space. In temperate zones, an outdoor temperature can reach about 40° C. in summer, and an indoor temperature is usually controlled to be about 20° C. by air conditioning. The temperature difference between indoor and outdoor may be about 20° C. The outdoor temperature in winter may be about −15° C., and the indoor temperature is usually controlled to be about 25° C. by heating or air conditioning, and the temperature difference between indoor and outdoor may be about 40° C. In tropical zones, the temperature difference between indoor and outdoor may be larger in summer. In highly cold areas, the temperature difference between indoor and outdoor may be larger in winter. When the electronic device described in the embodiments of the present disclosure is applied in a smart home device, it can generate electrical energy based on the natural temperature difference between indoor and outdoor to supply electrical energy to its load device 15 for operation, which can generate electricity based on the natural temperature difference between indoor and outdoor, to implement saving electrical energy and reduces the consumption of the electrical energy from the electric grid.

Moreover, it should be noted that the heat dissipation system in the present disclosure is different from a heat dissipation system in Seebeck effect, where a thermocouple is configured to dissipate heat from the electronic components. In the Seebeck effect, heat dissipated by the electronic components accelerate a heat conduction from the electronic components, which facilitates quick dissipation of the heat generated in the electronic components, so as to ensure that the electronic components are operating at a relatively low temperature to ensure their normal operation. The electronic device described in the embodiments of the present disclosure generates electricity based on the ambient temperature difference between the first space and the second space to supply power to the load device for operation. The objective is to take advantage of the natural temperature difference between the two spaces to generate electricity to supply power to its own load for operation, but not for cooling of the electronic components.

In particular, the electronic device may match the connection between the output port of the electric power generating device 14 and the input port of the load device 15 based on the electrode property that correspond to the thermo-electromotive force, to supply the electrical energy matching the corresponding electrode property to the load device 15. The connection of the output port of the electric power generating device 14 to the input port of the load device 15 may be automatically matched by the temperature sensor 31, the switching component 20 and the controller 32, so as to automatically supply the electrical energy matching the corresponding electrode property to the load device 15. In other implementation manners, the switching component 20 may also be manually switched based on the temperature difference.

When positive and negative signs of the temperature difference between the first ambient temperature corresponding to the first space and the second ambient temperature corresponding to the second space change, the load device 15 can be maintained to obtain the electrical energy matching the corresponding electrode property. For example, if an indoor space is used as the first space and an outdoor space is used as the second space, in winter, the first ambient temperature is higher than the second ambient temperature, and a first thermo-electromotive force corresponding to a first electrode property is generated. In summer, the first ambient temperature is lower than the second ambient temperature, and a second thermo-electromotive force corresponding to a second electrode property is generated. The first electrode property and the second electrode property are opposite. As such, regardless of summer or winter, the thermo-electromotive force and the load device 15 can be adjusted to be matched according to changes of the temperature difference between the indoor ambient temperature and outdoor ambient temperature, to ensure the normal operation of the electronic device.

In some embodiment of the present disclosure, the electronic device may have a housing. The housing has at least one electronic component therein. An internal space of the housing is the first space, and an external space of the housing is the second space. An operation of the electronic component causes the temperature difference between the first ambient temperature and the second ambient temperature. The electronic component generates heat, which causes the first ambient temperature to be higher than the second ambient temperature. For example, the electronic device may be a computer housing, a server housing, or a television housing, and electricity may be generated based on an internal and external temperature difference caused by the heat dissipation of the electronic device in operation. Or, the electronic component transfers heat from the first space to the second space, so that the first ambient temperature is lower than the second ambient temperature. For example, the electric device may be a refrigerator or a freezer, etc., and electricity may be generated based on a temperature difference implemented by a temperature adjustment function of the electronic device.

Figure 5:
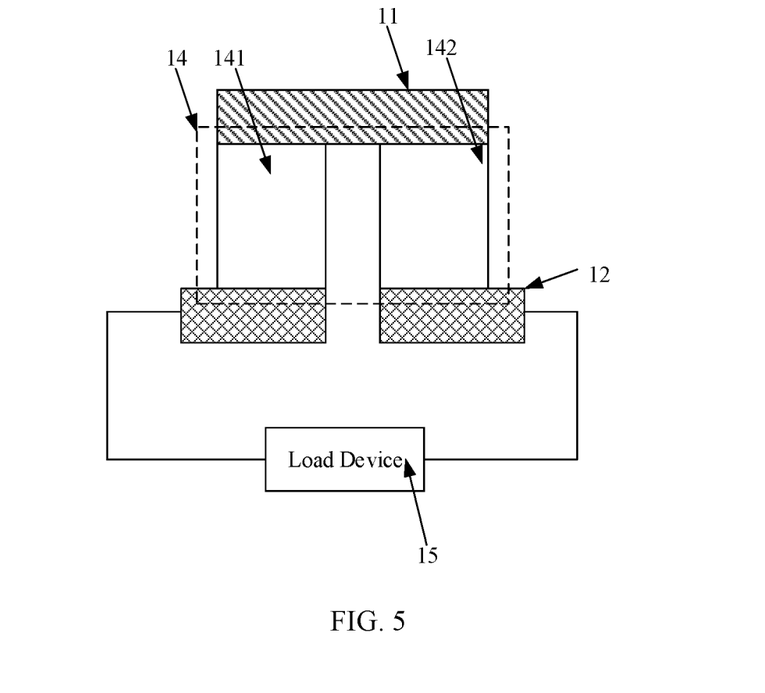
FIG. 5 illustrates a principle of thermoelectric power generation by an electronic device according to some embodiment of the present disclosure.

In some embodiment of the present disclosure, the principle of generating thermo-electromotive force by an electronic device may be shown in FIG. 5. FIG. 5 illustrates a principle of thermoelectric power generation by an electronic device according to some embodiment of the present disclosure. The electric power generating device 14 includes a thermoelectric power generating assembly based on the Seebeck effect. The thermoelectric power generating assembly includes at least one thermocouple assembly. The thermocouple assembly includes a first component 141 and a second component 142. The first portion 11 and the second portion 12 are conductive materials, and the first component 141 and the second component 142 are electrically interconnected. The first component 141 and the second component 142 are two different electrical conductors or semiconductors. When there is a temperature difference between the ambient temperature of the first space and the ambient temperature of the second space, both carriers (electrons and holes) move to the end with a higher temperature, thereby generating a thermo-electromotive force.

As shown in FIG. 5, in the thermo-electric power generating assembly, the first component 141 and the second component 142 are spaced apart, and upper ends of both are connected to the first portion 11, and lower ends of both are connected to the second portion 12, respectively. The first portion 11 is at the first ambient temperature, and the second portion 12 is at the second ambient temperature. When the first ambient temperature is different from the second ambient temperature, a thermo-electromotive force is generated between the two second portions 12 due to the Seebeck effect so that electricity can be generated.

Figure 6:
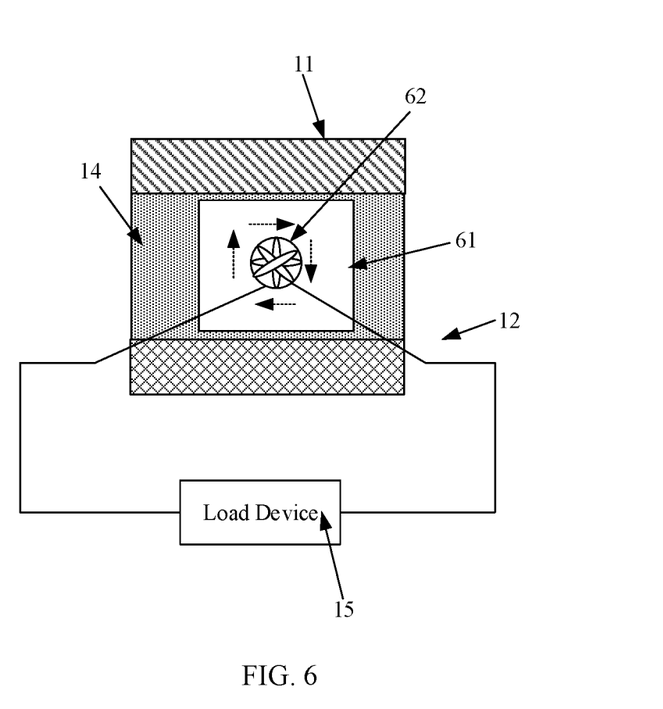
FIG. 6 illustrates a principle of thermoelectric power generation by an electronic device according to another embodiment of the present disclosure.

In some embodiment of the present disclosure, the principle of thermo-electromotive force generation by an electronic device can be shown in FIG. 6. FIG. 6 illustrates a principle of thermoelectric power generation by an electronic device according to another embodiment of the present disclosure. In the manner shown in FIG. 6, the electric power generating device 14 is located between the first portion 11 and the second portion 12 which are opposite to each other. The electric power generating device 14 has a chamber 61. The chamber 61 has a circulation channel therein and a fluid medium in the circulation channel. The circulation channel and fluid medium are not shown in FIG. 6. The fluid medium may be a low boiling point medium, which changes from a liquid state to a gaseous state at an end near the high-temperature space. The gas flows toward an end near the low-temperature space to drive the motor 62 to rotate, and is cooled from a gaseous state to a liquid state at an end near the low-temperature space, and then flows back to the end near the high-temperature space, so as to achieve a circulation of the flow.

When the first ambient temperature and the second ambient temperature are different, based on the temperature difference, the fluid medium can be driven to circulate in a preset direction (as shown by the dotted arrow in FIG. 6) to drive the motor 62 to rotate, thereby generating a thermo-electromotive force. When the first ambient temperature is higher than the second ambient temperature, the fluid medium circulates in a first direction, and conversely, circulates in a reverse direction to the first direction. In the two cases, the motor rotates in opposite directions, and the electrode properties in each case corresponding to the thermo-electromotive force are opposite.

Accordingly, based on the foregoing description that, in the electronic device described in some embodiments of the present disclosure, two openings that connect two spaces are disposed in the electronic, which take advantages of the difference in ambient temperatures between the two spaces to generate electricity. The electromotive force can be generated based on the difference in ambient temperatures and generated electrical energy can be supplied to the load device 15 of the electronic device.

The electronic device may be a smart lock. At this time, it can be installed on a body such as a door or a window. One of the first space and the second space is an indoor space, and the other is an outdoor space. The opposite surfaces of the body correspond to the first indoor space and the second space, respectively. Two handles are respectively disposed on the two surfaces, and the two handles can be respectively fixed to the body by two housings, and an electronic lock core is disposed between the two housings. One handle is configured to fix the first portion, and the other handle is configured to fix the second portion. As such, the electronic device can be installed based on the inherent structure of the body of the door or window without changing the body structure. The load device may be an electronic lock core of the smart lock configured to supply power to the electronic lock core. Alternatively, a power module of the electronic lock core may be configured to charge the power module.

The electronic device described in the embodiments of the present disclosure generates electrical energy based on the temperature difference existing in the first space and the second space, and accordingly, can generate electricity based on the temperature difference between the indoor and the outdoor. For example, in cold winter or hot summer, the temperature difference between the indoor and the outdoor can reach tens of degrees, and a full use of the temperature difference can be made to generate electricity thereby reducing the power consumption of the electric grid. The electronic device may be applied in electronic door mirrors, door magnets, smart locks or sensors for doors and windows with low energy consumptions. These devices are not used frequently, and accordingly, electrical energy generated by the thermo-electromotive force can meet all or part of the electrical energy demand.

In other implementation manners, electric power generation can also be implemented based on a temperature difference between an inside and an outside of the electronic device housing during the operation of the electronic device, to supply electrical energy to the load for operation. At this time, the electronic device can be a device having a large temperature difference between the inside and the outside of the device such as a computer, a server, a refrigerator, or a freezer, thereby making full use of the temperature difference to generate electricity which can reduce the power consumption from the electric grid.

The embodiments in this specification are described in a progressive manner. Each embodiment focuses on the distinctions from other embodiments. Reference may be made to each other for the same and similar parts between the embodiments.

It should also be noted that in the present disclosure, relational terms such as first and second are used only to distinguish one entity or operation from another entity or operation, and do not necessarily require or imply an actual relationship or an order among these entities or operations. Moreover, the terms "comprising," "including," or any other variation thereof are intended to encompass non-exclusive inclusion, such that an article or device that includes a series of elements includes not only those elements, but also other elements that are not explicitly listed; or it may include elements inherent to such an article or device. Without more restrictions, the elements defined by the sentence "including one . . . " do not exclude the existence of other identical elements in articles or devices including the above-mentioned elements.

The above description of the disclosed embodiments of the present disclosure can enable those skilled in the art to implement or use the present disclosure. A variety of modifications to these embodiments may be apparent to those skilled in the art, and the general principles defined herein may be implemented in other embodiments without departing from the spirit or scope of the disclosure. Therefore, the present disclosure is not limited to the embodiments shown herein, but should conform to the widest scope consistent with the principles and novel features disclosed in the present disclosure.

What is claimed is:

1. An electronic device, comprising:
    a first portion and a second portion, the electronic device being disposed in an opening of a connected space, the electronic device and a wall having the opening dividing the connected space into the first space and the second space, the first portion being located in a first space having a first ambient temperature, and the second portion being located in a second space having a second ambient temperature;
    an electric power generating device configured to generate a first thermo-electromotive force in responding to the first ambient temperature being higher than the second ambient temperature, and to generate a second thermo-electromotive force in responding to the first ambient temperature being lower than the second ambient temperature;
    a load device configured to obtain the electrical energy and operate on the electrical energy; and
    a switching component configured to match a connection between an output port of the electric power generating device and an input port of the load device based on an electrode property of the thermo-electromotive force, to supply electrical energy that matches a corresponding electrode property to the load device, wherein respective electrode properties provide opposite corresponding electrical or energy characteristics corresponding to the respective first and second thermos-electromotive forces.

2. The electronic device according to claim 1, further comprising:
    a temperature sensor configured to detect the first ambient temperature and the second ambient temperature; and
    a controller configured to match a connection between the output end of the electric power generating device and an input port of the load device based on the first ambient temperature and the second ambient temperature and enable the load device to obtain the electrical energy that matches a corresponding electrode property.

3. The electronic device according to claim 1, further comprising:
    a movable body connected to the wall having the opening; wherein:
        in response to the body and the opening satisfying a full coverage condition, the first space is separated from the second space; and
        in response to the body and the opening not satisfying a full coverage condition, the first space is connected to the second space.

4. The electronic device according to claim 3, wherein a collecting device is disposed on the body, being configured to perceive a situation of the second space in the first space.

5. The electronic device according to claim 3, wherein the electronic device is configured to: control a movement scope of the body, or to detect whether the body is moving, or to detect whether the body and the opening satisfy the full coverage condition.

6. The electronic device according to claim 3, wherein:
    the first portion and the second portion are respectively fixed to two opposite surfaces of the body, the electric power generating device being located between the first portion and the second portion.

7. The electronic device according to claim 1, further comprising:
    a housing, the housing having at least one electronic component therein, an internal space of the housing being the first space, an external space of the housing being the second space, and the at least one electronic component causing the first ambient temperature to be different from the second ambient temperature during operation.

8. The electronic device according to claim 7, wherein:
    the at least one electronic component generates heat during operation, causing the first ambient temperature to be higher than the second ambient temperature; or the electronic component transfers heat from the first space to the second space, causing the first ambient temperature to be lower than the second ambient temperature.

* * * * *